(12) United States Patent
Takeuchi

(10) Patent No.: US 8,035,182 B2
(45) Date of Patent: Oct. 11, 2011

(54) SENSOR, SOLID-STATE IMAGING DEVICE, AND IMAGING APPARATUS AND METHOD OF MANUFACTURING THE SAME

(75) Inventor: Kiyoshi Takeuchi, Chiba (JP)

(73) Assignee: Sony Corporation, Tokyo (JP)

(*) Notice: Subject to any disclaimer, the term of this patent is extended or adjusted under 35 U.S.C. 154(b) by 340 days.

(21) Appl. No.: 12/354,428

(22) Filed: Jan. 15, 2009

(65) Prior Publication Data
US 2009/0184387 A1    Jul. 23, 2009

(30) Foreign Application Priority Data
Jan. 18, 2008  (JP) ................. 2008-009474

(51) Int. Cl.
*H01L 31/02* (2006.01)
(52) U.S. Cl. .......... 257/440; 257/72; 257/E31.113; 438/97

(58) Field of Classification Search .......... 257/72, 257/440, E31.113, E31.043, E29.3; 438/97
See application file for complete search history.

(56) References Cited

U.S. PATENT DOCUMENTS
5,965,875 A  10/1999  Merrill
7,141,824 B2 * 11/2006 Forbes et al. .......... 257/77

FOREIGN PATENT DOCUMENTS
JP   2005-010114   1/2005
* cited by examiner

*Primary Examiner* — Roy K Potter
(74) *Attorney, Agent, or Firm* — SNR Denton US LLP

(57) ABSTRACT

A sensor is provided. The sensor includes semiconductor layer; a photodiode, an impurity-doped polycrystalline silicon layer; and a gate electrode. The photodiode is formed in the semiconductor layer. The impurity-doped polycrystalline silicon layer is formed above the semiconductor layer. The gate electrode applies a gate voltage to the polycrystalline silicon layer. A wiring layer is provided on a first surface of the semiconductor layer and light is incident on a second surface thereof.

9 Claims, 11 Drawing Sheets

SENSOR, SOLID-STATE IMAGING DEVICE, AND IMAGING APPARATUS AND METHOD OF MANUFACTURING THE SAME

CROSS REFERENCES TO RELATED APPLICATIONS

The present invention contains subject matter related to Japanese Patent Application JP 2008-009474 filed in the Japanese Patent Office on Jan. 18, 2008, the entire contents of which being incorporated herein by reference.

BACKGROUND OF THE INVENTION

1. Field of the Invention

The present invention relates to a sensor for detecting the wavelength and intensity of incident light. The present invention also relates to a solid-state imaging device. The present invention further relates to an imaging apparatus using such a solid-state imaging device and a method of manufacturing the same.

2. Description of the Related Art

An attempt for obtaining information about three primary colors (RGB) by a single photodiode has been conducted (see, for example, U.S. Pat. No. 5,965,875).

The photodiode as described in U.S. Pat. No. 5,965,875 has an arrangement of pixels where each pixel includes a stacked structure of three diffusion layers with different depths, 0.2 μm, 0.6 μm, and 2 μm, formed on a silicon substrate. Thus, each pixel has a three-layered structure where the layers have different depths. These layers are designed to transmit and receive light with different wavelengths, three primary colors of light (RGB: red (R), green (G), and blue (B)), respectively, based on transmitting characteristics of silicon.

For example, all the wavelengths of RGB are incident on the pixel from the surface of the silicon substrate and all of them are taken in the top layer, RG except B absorbed by the top layer is taken in the middle layer, and R except BG absorbed by the top and middle layers is taken in the bottom layer. Then, the value of R taken in the bottom layer is subtracted from RG taken in the middle layer to obtain the value of G. Subsequently, the values of R and G are subtracted from the value of RGB to obtain the value of B.

The photodiode is configured as described above, so that an image obtained by directly taking the primary colors of light can be generated in spite of including a single chip.

The above photodiode is designed to take each element out of RGB in the depth direction. However, the photodiode may not change the position for capturing electrons and further the circuit configuration thereof may be complicated, causing insufficient design flexibility. Furthermore, every pixel continuously generates independent data of information about respective colors. Thus, it is difficult to distinguish correct data from noise in a portion where the data is continuously generated and obtain RGB characteristics. Therefore, complicated software may be required for determining the RGB characteristics.

In consideration of the above, there has been proposed a sensor with a single photodiode corresponding to incident light having a structure for controlling the potential depth of the photodiode by changing a gate voltage (see, for example, Japanese Unexamined Patent Application Publication No. 2005-10114). The sensor changes the gate voltage to allow the depth for capturing electrons generated by light incident on the photodiode to be changed in response to the gate voltage, determining the wavelength and intensity of the incident light.

SUMMARY OF THE INVENTION

However, the sensor as described in Japanese Unexamined Patent Application Publication No. 2005-10114 is designed to allow light to be incident on the front side of an imaging device with electrodes and a circuit part provided thereon. That is, the circuit and the like are formed on the light-receiving side of the imaging device. Thus, an opening area for the incident light may be narrow, causing a decrease in amount of light received. Furthermore, it also results in a decrease in sensitivity. In addition, the use of a transparent electrode leads to an extreme decrease in sensitivity to light at a shorter wavelength region, such as ultraviolet or blue region.

It is desirable to provide a sensor capable of a highly sensitive spectroscopic measurement with a single photodiode, a solid-state imaging device, and an imaging apparatus and a method of manufacturing the same.

According to an embodiment of the present invention, there is provided a sensor including a semiconductor layer, a photodiode formed in the semiconductor layer, an impurity-doped polycrystalline silicon layer formed above the photodiode, and a gate electrode applying a gate voltage to the polycrystalline silicon layer. A wiring layer is provided on one surface of the semiconductor layer and light is incident on the other surface thereof.

According to another embodiment of the present invention, there is provided a solid-state imaging device including pixels and a pixel region formed of a two-dimensional arrangement of the pixels. The pixel includes a semiconductor layer, a photodiode formed in the semiconductor layer, an impurity-doped polycrystalline silicon layer formed above the photodiode, and a gate electrode applying a gate voltage to the polycrystalline silicon layer. A wiring layer is provided on one surface of the semiconductor layer and light is incident on the other surface thereof.

According to further embodiment of the present invention, there is provided an imaging apparatus including an optical unit, a solid-state imaging device, and a signal processing unit. The solid-state imaging device includes pixels and a pixel region formed of a two-dimensional arrangement of the pixels. The pixel includes a semiconductor layer, a photodiode formed in the semiconductor layer, an impurity-doped polycrystalline silicon layer formed above the photodiode, and a gate electrode applying a gate voltage to the polycrystalline silicon layer. A wiring layer is provided on one surface of the semiconductor layer and light is incident on the other surface thereof.

According to further another embodiment of the present invention, there is provided a method of manufacturing an imaging apparatus including the steps of: forming a photodiode in a semiconductor layer; forming an impurity-doped polycrystalline silicon layer above the photodiode; forming a gate electrode applying a gate voltage to the polycrystalline silicon layer. A wiring layer is provided on one surface of the semiconductor layer and light is incident on the other surface thereof.

The sensor according to an embodiment of the invention includes the wiring layer on one surface of the semiconductor layer and light is incident on the other surface thereof. Thus, any wiring layer or transparent electrode is not formed above the photodiode. The spectroscopic characteristics in a wide range of wavelengths extending to the ultraviolet region can be determined with a high sensitivity. In addition, a color picture is obtained from the resulting spectroscopic characteristics. Therefore, both the solid-state imaging device and the imaging apparatus according to the above embodiments of the present invention can be highly sensitive in a wide range of wavelengths.

According to the above embodiments of the invention, the use of the single photodiode allows a high sensitive determination of the spectroscopic characteristics.

BRIEF DESCRIPTION OF THE DRAWINGS

FIG. 8A and FIG. 8B illustrate different steps.

FIG. 9A, FIG. 9B, and FIG. 9C illustrate different steps.

DESCRIPTION OF THE PREFERRED EMBODIMENTS

Prior to describing specific examples according to an embodiment of the present invention, the outline of the present invention will be described.

According to an embodiment of the present invention, there is provided an imaging device which can carry out spectroscopic measurement. Light incident on the semiconductor device enters the semiconductor device and the wavelength of light to be subjected to photoelectric conversion varies depending on the depth from the surface of the device. Using such characteristics of the light, a gate electrode is mounted on a sensor in the semiconductor device to carry out variable control of the potential of a quantum well structure in which electrons converted from photons are accumulated, allowing the measurement of spectral characteristics. Furthermore, a solid-state imaging device for obtaining a color image from the measured spectral characteristics can be configured using such a sensor as a pixel.

First, the basic principle for acquiring the information about the wavelength of light incident on the surface of a semiconductor will be described with reference to FIG. 1.

If light is incident on the semiconductor, then the energy hv of the light causes an electron-hole pair in a semiconductor. Here, h denotes Planck's constant and v denotes the number of optical frequency.

This phenomenon is due to the interaction between the light and the semiconductor and depends on the type of the semiconductor and the wavelength of the light. For example, if the semiconductor is of a silicon (Si), the semiconductor has a bandgap Eg (forbidden band) of about 1.1 V. Thus, the excitation of electrons from a valence band to a conductive band occurs with respect to the incident light with hv>Eg, changing the light into electrons. At this time, the wavelength of the light ($\lambda_0$) which serves as $hv_0=hc/\lambda_0=Eg$ is referred to as a fundamental absorption end, providing the upper limit of the wavelength of the light to be photoelectrically converted in the semiconductor. For example, $\lambda_0 \approx 1.0$ μm in the case of Si.

Figure 1:
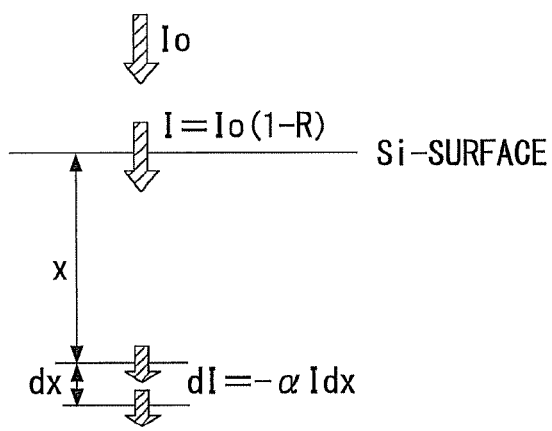
FIG. 1 is a diagram illustrating a basic principle for obtaining information about a wavelength of light incident on a surface of a semiconductor.

Furthermore, as shown in FIG. 1, viewing from the region where the absorption takes place, the intensity of light actually incident on the semiconductor is $(1-R) \cdot I_0$, where $I_0$ denotes the intensity of incident light and R denotes the reflection of light on the surface of the semiconductor. If (I) is the intensity of light at the position of the depth x from the surface of the semiconductor and (I+dI) is the intensity of light at the position (x+dx), then absorption coefficient $\alpha$ that satisfies $dI=-\alpha \cdot I \cdot dx$ can be defined. If the equation is integrated, then the resulting equation is as follows:

[Equation 1]

$$I=I_0(1-R)e^{-\alpha x} \quad (1)$$

The equation (1) represents an optical intensity distribution in the depth direction of the semiconductor, where an effectual absorption region may be almost up to $x_0=1/\alpha$.

Figure 2:
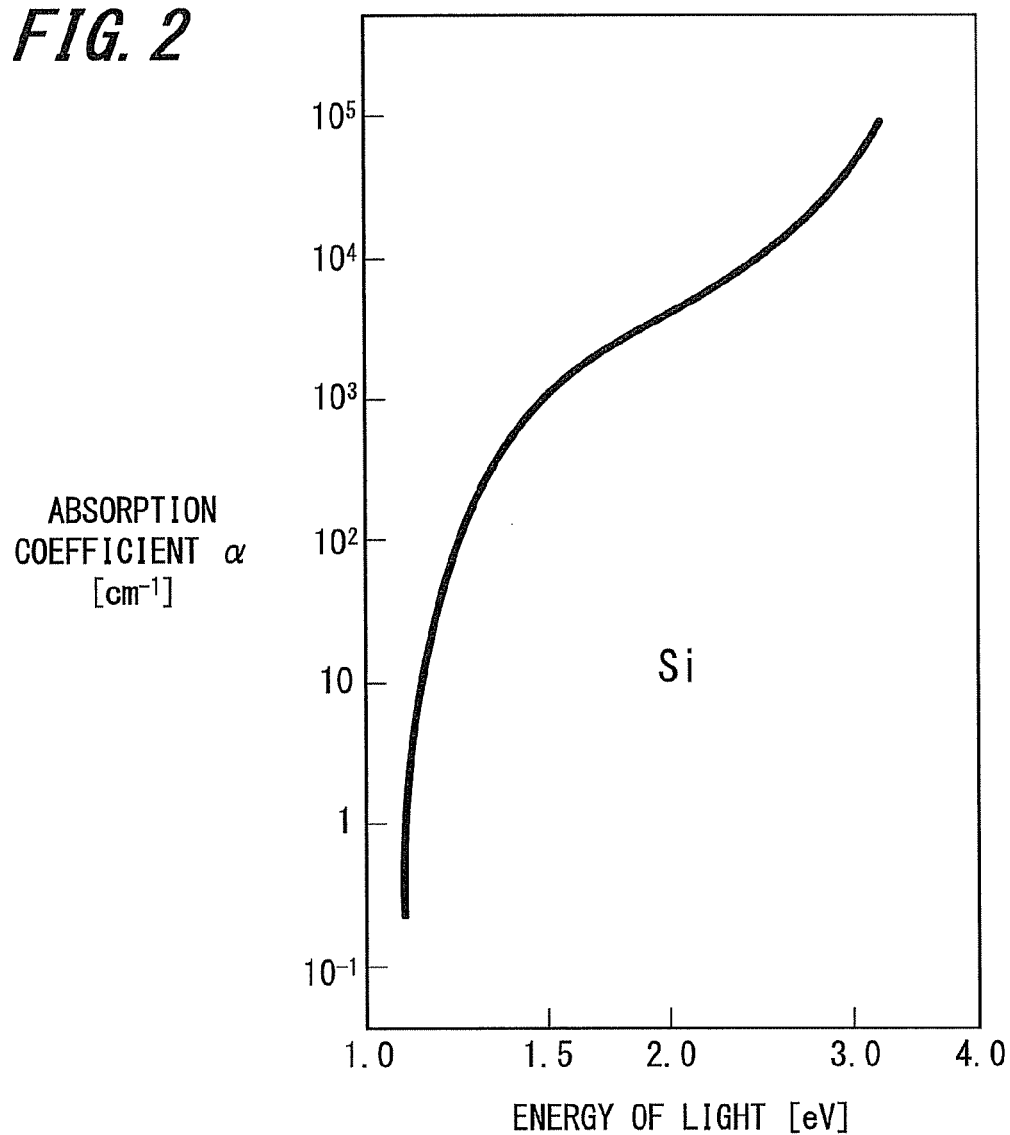
FIG. 2 is a diagram illustrating a wavelength dependency of energy of light incident on a semiconductor and an absorption coefficient $\alpha$.

Next, FIG. 2 represents the wavelength dependency of the energy (eV) of light incident on the semiconductor and the absorption coefficient $\alpha$ (cm$^{-1}$). The higher the energy of a photon (the shorter the wavelength) increases, the higher the value of the absorption coefficient $\alpha$ increases. In addition, the effectual absorption region becomes shallow. In other words, light at shorter wavelengths can be almost absorbed and photoelectrically converted at a position near the surface of the semiconductor. In contrast, light at longer wavelengths can reach to a deeper position from the surface of the semiconductor and photoelectrically converted.

According to an embodiment of the present invention, a current generated by changing the potential depth which can collect electrons (or holes) generated by the light incident on the semiconductor device is measured. This method can obtain the information about the wavelength of incident light.

For example, if monochromatic light is incident, then the current generated until the light reaches to the depth (position) W from the surface of the semiconductor can be determined by calculation. If the light is incident on the semiconductor, then the intensity of the light can be decreased exponentially. Therefore, the light intensity Φ at a certain depth x can be represented by the following equation:

[Equation 2]

$$\Phi=\Phi_0 e^{-\alpha x} \quad (2)$$

In the formula, $\Phi_0$ denotes the intensity of incident light [w/cm²] and α denotes an absorption coefficient [cm⁻¹].

Then, the ratio of absorption until the light reaches to the depth W can be expressed by the following equation:

[Equation 3]

$$\frac{\int_0^W \phi_0 e^{-\alpha x} dx}{\int_0^\infty \phi_0 e^{-\alpha x} dx} = 1 - e^{\alpha W} \quad (3)$$

Then, the current generated until the light reaches to the depth W can be defined by the following equation:

[Equation 4]

$$I = \frac{\phi_0 S q}{hv}(1 - e^{-\alpha W}) \quad (4)$$

where, S denotes the surface area of a light-receiving portion [cm²], hv denotes the energy of light [J], and q denotes an electron volt [J].

If light rays with two different wavelengths (λ1 and λ2) are simultaneously incident with the intensities $A_1$ and $A_2$, respectively, a current due to electrons generated from an area from the surface of the semiconductor to the electron-capturing position $W_1$ is current $I_1$.

Next, if a current due to electrons generated from an area from the surface of the semiconductor to the electron-capturing position $W_2$ is measured and resulted in current $I_2$, the above equation (4) can be represented by the following equation with the wavelengths of the respective separated light rays:

[Equation 5]

$$\begin{cases} I_1 = \frac{A_1 Sq}{hv_1}(1 - e^{-\alpha_1 W_1}) + \frac{A_2 Sq}{hv_2}(1 - e^{-\alpha_2 W_1}) \\ I_2 = \frac{A_1 Sq}{hv_1}(1 - e^{-\alpha_1 W_2}) + \frac{A_2 Sq}{hv_2}(1 - e^{-\alpha_2 W_2}) \end{cases} \quad (5)$$

In the equation (5), $A_1$ and $A_2$ denote the intensities of incident light [W/cm²], S denotes the surface area of a light-receiving portion (cm²), $W_1$ and $W^2$ denote electron-capturing positions [cm], $\alpha_1$ and $\alpha_2$ represent the absorption coefficients at the respective wavelengths [cm⁻¹], $I_1$ denotes an observed current level [A] when the electron-capturing position is $W_1$, and $I_2$ denotes an observed current level [A] when the electron-capturing position is $W_2$. In the equation (5), furthermore, $v_1$ denotes a frequency which can be expressed by $v_1=c/\lambda_1$ and $v_2$ denotes a frequency which can be expressed by $v_2=c/\lambda_2$. Here, c denotes the velocity of light, S denotes the area of a light-receiving unit, hv denotes the energy of light, and q denotes an electron volt. These parameters are known values except the intensities of incident light $A_1$ and $A_2$. The intensities of incident light $A_1$ and $A_2$ can be calculated by solving the simultaneous equations from these two equations. For example, the simultaneous equations can be represented as follows:

[Equation 6]

$$\begin{cases} A_1 = \frac{I_1 Z - I_2 X}{WZ - XY} \\ A_2 = \frac{I_2 Z - I_1 X}{WZ - XY} \end{cases} \quad (6)$$

The respective parameters in the equation (6) can be represented as follows:

[Equation 7]

$$W = \frac{Sq(1 - e^{-\alpha_1 W_1})}{hv_1} \quad X = \frac{Sq(1 - e^{-\alpha_2 W_1})}{hv_2} \quad (7)$$

$$Y = \frac{Sq(1 - e^{-\alpha_1 W_2})}{hv_1} \quad Z = \frac{Sq(1 - e^{-\alpha_2 W_2})}{hv_2}$$

For example, separating the incident light into light rays with three different wavelengths causes an increase in current $I_3$ for the electron-capturing position $W_3$ in the equation (4). Subsequently, the same calculation as for two wavelengths may be carried out to separate the entering light into three different wavelengths.

Likewise, if light with 100 different wavelengths is incident, then the measurement may be carried out while changing the electron-capturing position 100 times.

Hereinafter, embodiments of the present invention will be described in detail.

An embodiment of the present invention will be now described with reference to the block diagram in FIG. 3 and the circuit diagram in FIG. 4. In other words, a CMOS image sensor equipped with a column-parallel analog-digital convertor (ADC) is illustrated in FIG. 3 and FIG. 4.

Figure 3:
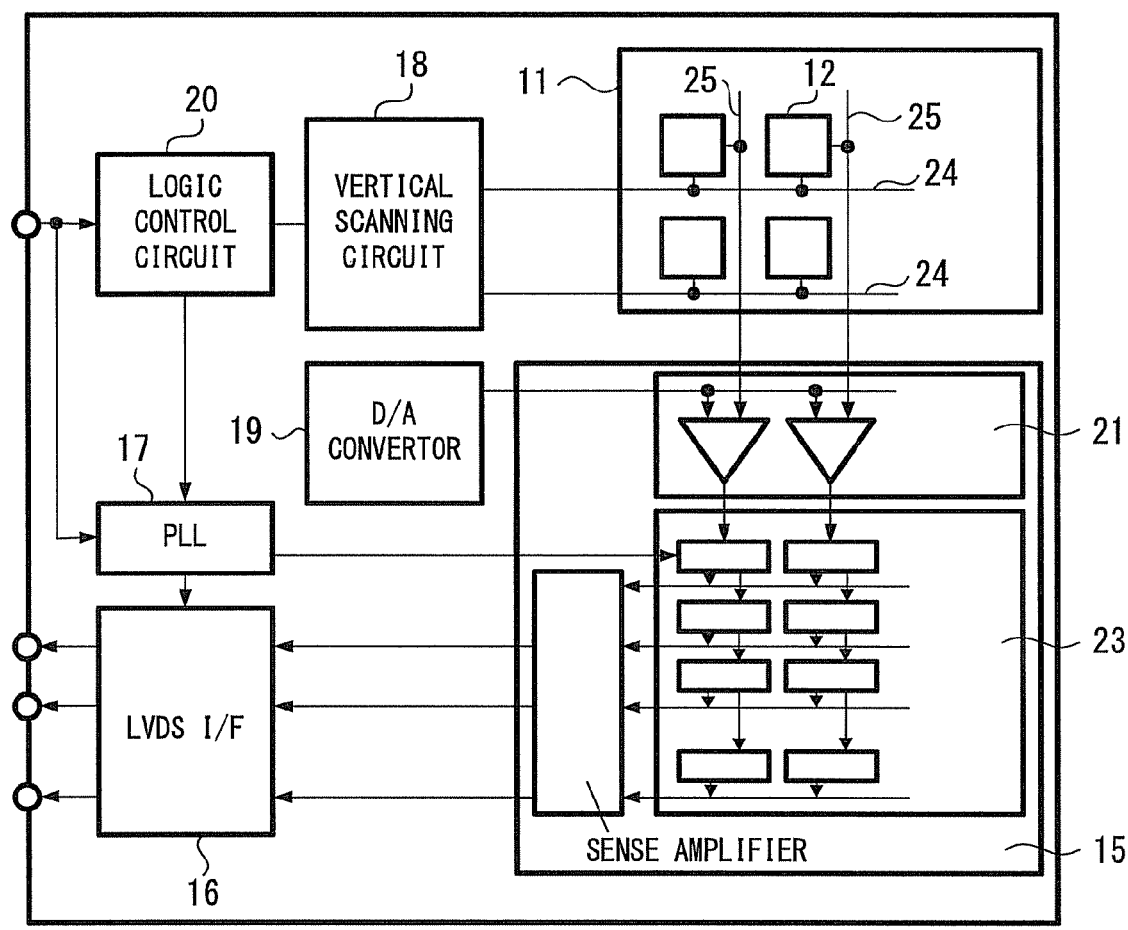
FIG. 3 is a block diagram illustrating a solid-state imaging device according to an embodiment of the present invention.
Figure 4:
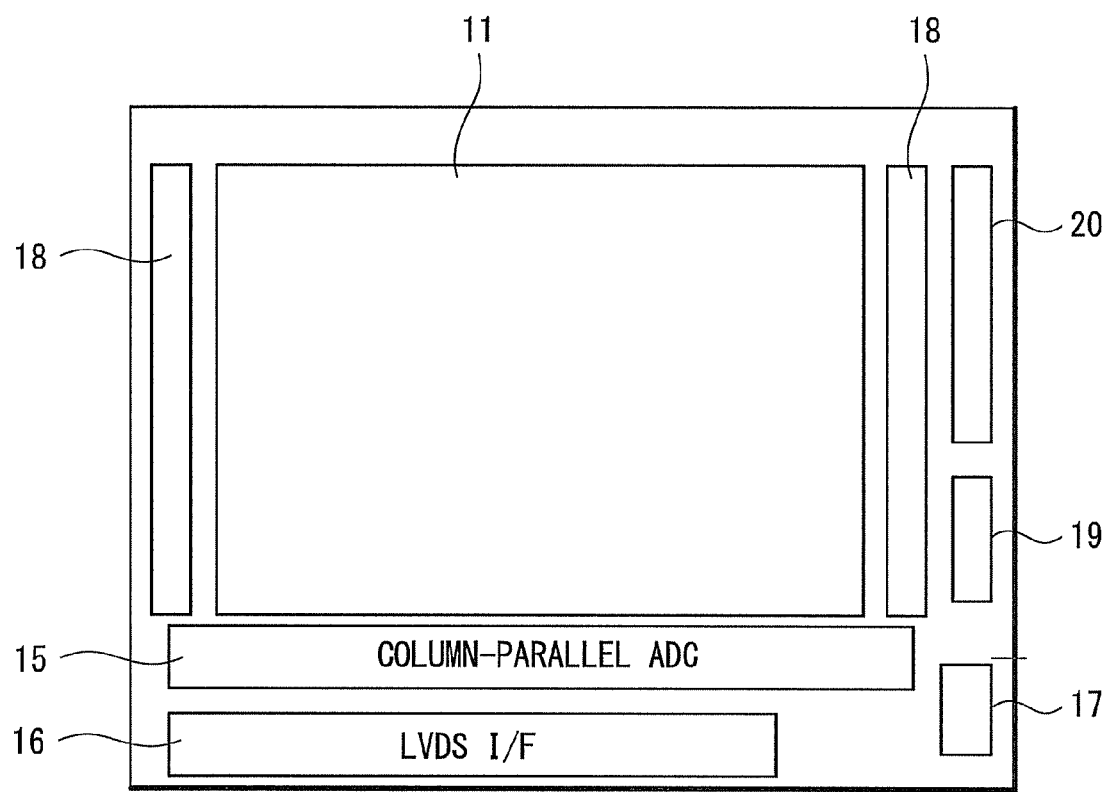
FIG. 4 is a schematic diagram illustrating a circuit configuration of a solid-state imaging device according to an embodiment of the present invention.

As shown in FIGS. 3 and 4, a solid-state imaging device 10 includes a pixel region 11, a vertical scanning circuit 18, a column-parallel analog-digital convertor (ADC) 15, a digital-analog converter (DAC) 19 that generates a ramp wave, a logic control circuit 20, and a digital output LVDS (low-voltage differential signaling) interface (I/F) 16.

The pixel region 11 includes a plurality of pixels 12. In this case, for example, the pixels 12 may be arranged in a matrix in a plane. Also, the pixel 12 is provided with the function of a sensor or the like and includes a photodiode, an impurity-doped polycrystalline silicon layer, and a gate electrode applying a gate voltage to the polycrystalline silicon layer. Furthermore, the pixel region 11 includes a pixel drive line 25 per column of pixels 12 and a vertical signal line 24 per line of pixels 12. Each pixel 12 in the pixel region 11 can be driven by the pixel drive line 25 extending in a column direction. In addition, a signal from the pixel 12 is an analog signal which can be output to the vertical signal line 24 extending in a line direction.

The column-parallel analog/digital converter (column parallel ADC) 15 includes a comparator 21 and a counter 23. The comparator 21 makes a comparison between a ramp wave generated from the DAC 19 and an analog signal from each pixel 12. Then, the counter 23 may be an up-down counter that counts a period of time required for completing the comparison by the comparator 21 and retains the result thereof.

The counter 23, which is the up-down counter, with a built-in phase locked loop (PLL) 17 can operate at high speed to generate a high-speed count clock.

Furthermore, control circuits for sequentially reading out signals from the pixel region 11 are arranged, including a logic control circuit 20 for generating an internal clock and a vertical scanning circuit 18 for controlling a line address and a line scanning.

The digital output LVDS interface (I/F) 16 processes a signal from the column-parallel ADC 15 and then outputs the result therefrom. For example, it may only carry out buffering or may carry out the adjustment of a black level, the correction of line variation, the processing of various digital signals, and so on.

Furthermore, but not specifically illustrated in the figure, other additional circuits for various kinds of signal processing may be arranged.

In the present embodiment, as described above, the column-parallel ADC 15 is formed of the comparator 21 and the counter (up-down counter) 23. Here, the up-down counter may be preferably an asynchronous up-down counter capable of high-speed operation with a single count-control clock.

The up-down counter has a preferable configuration for the present embodiment because of its many advantages, such as the simplification, high-speed operation, and so on of the circuit. Alternatively, counters may be doubly implemented in stead of the up-down counter or the counter may not be of column-parallel and formed of a doubled memory device.

Figure 5:
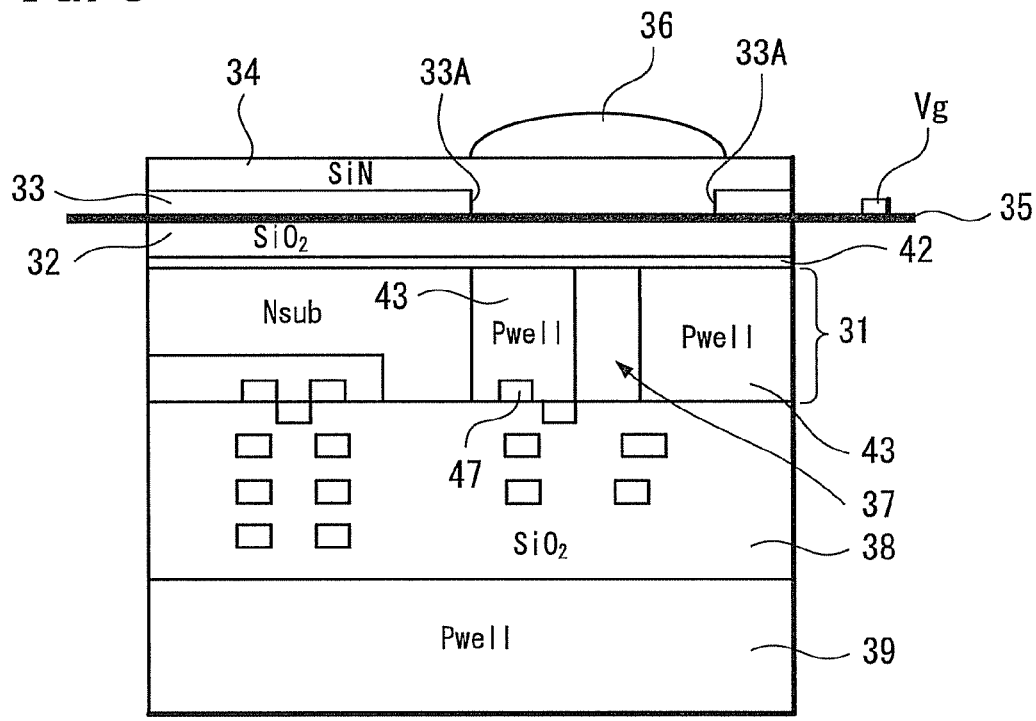
FIG. 5 is a cross-sectional diagram illustrating a configuration of a pixel region and a peripheral circuitry of a solid-state imaging device according to an embodiment of the present invention.

Next, FIG. 5 illustrates a pixel region and a peripheral circuitry of a solid-state imaging device of the present embodiment.

As shown in FIG. 5, a semiconductor 31 made of silicon (Si) or the like with a thickness of about 10 μm to 20 μm is formed by polishing a wafer by chemical mechanical polishing (CMP). The preferable range of such a thickness is 5 μm to 15 μm for visible light, 15 μm to 50 μm for infrared light, and 3 μm to 7 μm for ultraviolet light. On one side of the semiconductor layer 31, an insulating layer 32 made of $SiO_2$ or the like and a light-shading film 33 are formed with an impurity-doped polycrystalline silicon (poly-Si) layer 35 in between. In addition, a gate electrode Vg is formed on the impurity-doped polycrystalline silicon (poly-Si) layer 35. Here, the gate electrode Vg is made of the same impurity-doped polycrystalline silicon as the layer 35.

The light-shading film 33 is different from wiring and arranged in consideration of only an optical factor. An opening 33A is formed in the light-shading film 33. Also a passivation film 34, for example, a silicon nitride film (SiN), is formed on the light-shading film 33. Furthermore, a micro lens 36 is formed above the opening 33A.

In other words, light incident on one side of the semiconductor layer 31 is introduced through the micro lens 36 to the light-receiving surface of a photodiode 37, which will be described later, formed in the semiconductor layer 31. In addition, the other side of the semiconductor layer 31 is provided with a wiring layer 38 in which a transistor and a metal wiring line are formed. Furthermore, a substrate-supporting member 39 is attached to the lower side of the wiring layer 38.

The CMOS image sensor according to the related art employs a front-illuminated type pixel structure in which the wiring-layer side of the semiconductor layer is the top side thereof and the incident light is then allowed to be introduced from the wiring-layer side. In contrast, the CMOS image sensor of the present embodiment employs a back-illuminated type pixel structure where the incident light enters from the backside, that is, the surface opposite to the wiring layer 38, of the semiconductor. As is evident from the back-illuminated pixel structure, there is only the light-shading film 33 provided as a metal layer between the micro lens 36 and the photodiode 37. In addition, the height of the light-shading film 33 from the photodiode 37 is comparatively low with the film thickness (for example, about 0.5 μm) of the insulting layer 32. Therefore, light may be collected without being restricted by the metal layer.

Furthermore, the gate electrode Vg applies equal potentials on the respective photosensors. The gate electrode Vg may be formed on each photosensor part. Alternatively, one gate electrode Vg may be provided for covering all the photosensors. In addition, the gate electrode Vg is formed on a light-incident side.

Figure 6:
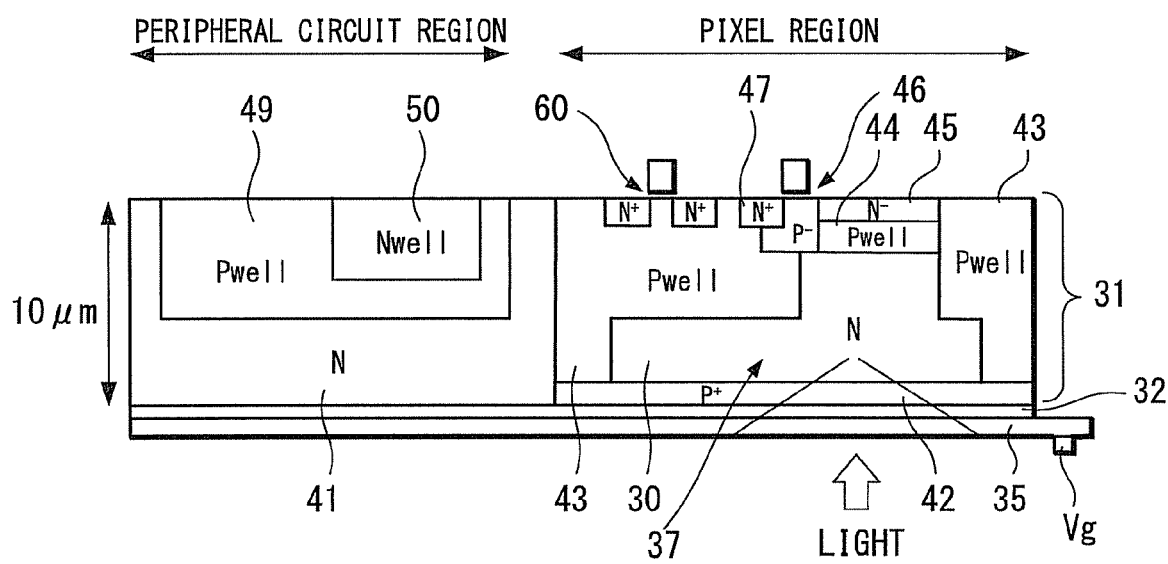
FIG. 6 is cross-sectional diagram illustrating an example of a configuration of a semiconductor layer shown in FIG. 5.

FIG. 6 is a cross-sectional diagram illustrating an example of the well structure of the semiconductor layer 31. In the figure, the same structural elements as those of FIG. 5 are designated by the same reference numerals.

In this example, the semiconductor layer 31 includes an N-type first conductivity-type impurity substrate 41. As described above, the thickness of the semiconductor layer 31 is preferably 5 μm to 15 μm for visible light. Thus, for example, the layer 31 has a thickness of 10 μm to efficiently carry out the photoelectric conversion of the visible light. At one end of the semiconductor layer 31, a shallow $P^+$-type second conductivity-type impurity region 42 covers the whole surface of the pixel region. A pixel-separating area is formed with a deep P-well type second conductivity-type impurity region 43 and connected to the $P^+$-type second conductivity-type impurity region 42 at one side of the semiconductor layer 31.

The N-type first conductivity-type impurity region 30 of the photodiode 37 is formed using an N-type first conductivity-type impurity substrate 41 without the formation of a P-well type second conductivity-type impurity region. The N-type first conductivity-type impurity region 30 is a region for the photoelectric conversion. The area of such a region is small and the concentration of the impurity is thin, so that it can be completely depleted. Besides, a P-well type second conductivity-type impurity region 44 for accumulating signal charges (electrons in this embodiment) is formed. In addition, an $N^-$-type first conductivity-type impurity region 45 to be provided as an embedded photodiode is formed on the above region 44. Furthermore, an insulating layer 32 and an impurity-doped polysilicon layer 35 are formed on the semiconductor layer 31. Moreover, a gate electrode Vg is formed on the impurity-doped polysilicon layer 35.

As described above, the sensor of the present embodiment is constructed of the gate electrode Vg, the polysilicon layer 35, the insulating layer 32, and the photodiode 37. In addition, the photodiode 37 includes the $P^+$-type second conductivity-type impurity region 42, the N-type first conductivity-type impurity region 30, the P-well type second conductivity-type impurity region 44, and the $N^-$-type first conductivity-type impurity region 45. In other words, the sensor includes the photodiode 37 with a $P^+NPN$ conjunction structure, the polysilicon layer 35 formed on the photodiode 37, and the gate electrode Vg formed on the polysilicon layer 35 for applying a gate voltage thereto.

A color image is obtained from spectroscopic characteristics determined with the above sensor. Therefore, the configuration of the above sensor can be employed as a pixel region of the solid-state imaging device.

According to the above structure of the photodiode, the discharge place (overflow drain) of excess signal charges is not on the same plane as that of the photodiode but on the backside of the semiconductor substrate. Therefore, there is no need of forming an overflow function element on the surface of the semiconductor device, so that the surface area of the photodiode can be increased more. The configuration of the photodiode allows the utilization efficiency of the incident light to be increased, enhancing the sensitivity of an imaging device. In addition, the configuration of the photodiode is capable of increasing the amount of signal charges which can be accumulated in the photodiode. Furthermore, the configuration of the above photodiode prevents the photodiode from accumulating electrons generated from the depth of the substrate by light with a long wavelength. It can suppress a phenomenon known as a smear, or a phenomenon that generates white stripe-shaped noise on the upper and lower parts of an image of a subject with high intensity, caused when part of the above electrons is mixed with signal charges in transmission.

Furthermore, as shown in FIG. 6, the photodiode 37 is formed so that the surface area thereof on the side of the light-receiving surface can be wider than that on the side of the wiring layer 38. Therefore, the opening 33A becomes large, collecting the incident light efficiently. A transfer transistor 46 transmits signal charges, which are photoelectrically converted by the photodiode 37 and then accumulated in the P-well type second conductivity-type impurity region 44, to a floating diffusion (FD) 47 of the N+-type first conductivity-type impurity region. The photodiode 37 and the FD 47 are electrically separated by the P−-type second conductivity-type impurity region.

Other transistors 60 which are different from the transfer transistor 46 in the pixel are typically formed on a deep P-well type second conductivity-type impurity region 43. On the other hand, on the periphery circuit region, a P-well type second conductivity-type impurity region 49 is formed at the depth that may not reach to the P+-type second conductivity-type impurity region 42 on the backside. Further, an N-well first conductivity-type impurity region 50 is formed on the inside of the P-well second conductivity-type impurity region 49. Then, a CMOS circuit is formed on the P-well second conductivity-type impurity region 49 and the N-well first conductivity-type impurity region 50.

Figure 7:
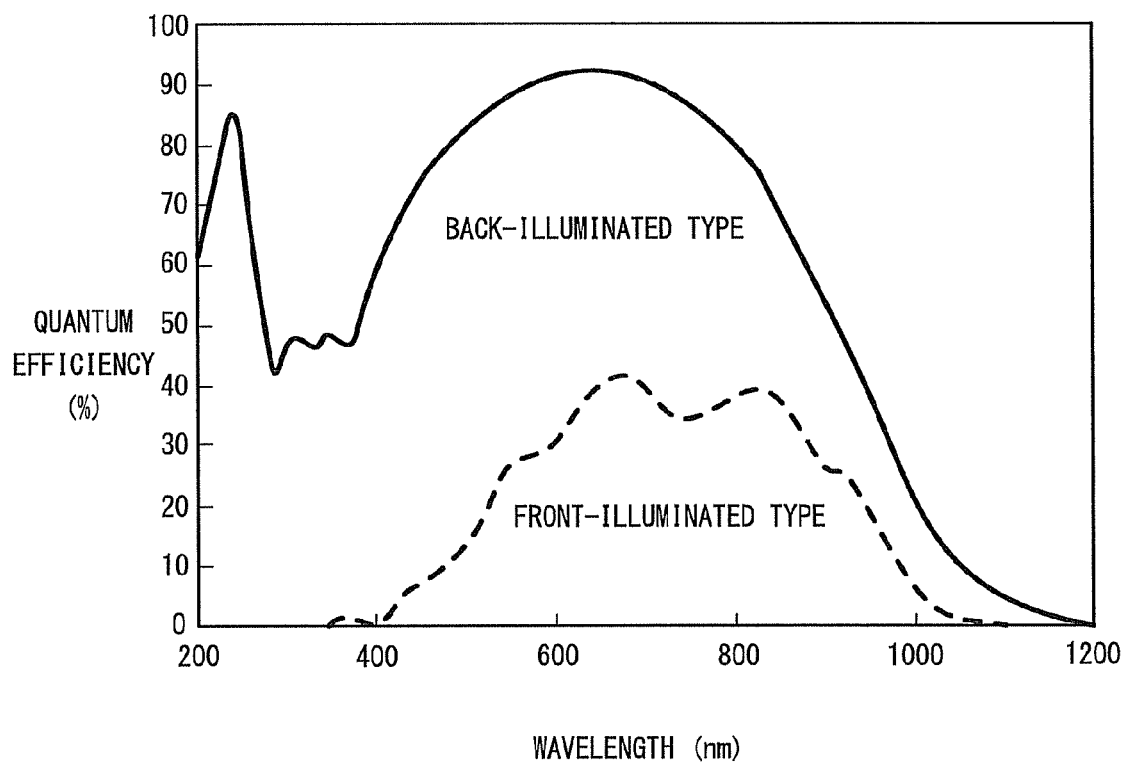
FIG. 7 is a graph illustrating a relationship between the wavelengths and the quantum efficiencies of both back-illuminated and front-illuminated imaging devices.

A solid-state imaging device using the above sensor is a back-illuminated imaging device, such as CCD or CMOS. Therefore, for example, FIG. 7 illustrates an example of the relationship between the wavelength (nm) of the incident light and the quantum efficiency (photoelectric conversion efficiency) (%). The sensitivity of the back-illuminated imaging device is higher than that of the front-illuminated, because circuits or the like for reading out charges from the photodiode are not provided on the light-incident side. In addition, transparent electrode which is required for the front-illuminated imaging device may not be required, so that the back-illuminated imaging device will have high quantum conversion efficiency at a wide wavelength region from the ultraviolet to the infrared region.

The solid-state imaging device using the above sensor is configured to carry out the voltage control of a quantum well potential with a change in gate voltage from the gate electrode Vg. The imaging device has the dependence of wavelength in the depth direction and the high sensitivity because of the backside illumination thereof.

The above image sensor is driven by changing the gate voltage in response to the vertical read out. An example of the process of spectroscopic measurement of the incident light carried out by driving the imaging device will be described.

An impurity-doped polycrystalline silicon film that transmits light and can be applied with a voltage as described above is provided.

First, for example, a gate voltage of one volt is applied to the impurity-doped polysilicon film and the current passing therethrough is then read out.

Next, a gate voltage of two volts is applied to the polycrystalline silicon film and the current passing therethrough is then read out.

Next, a gate voltage of five volts is applied to the polycrystalline silicon film and the current passing therethrough is then read out.

Next, on the basis of the current value measured as described above, the intensity of the incident light at each wavelength is calculated from the above equation (2).

For example, as the visible region has a 300-nm wavelength width extending from 400 nm to 700 nm, spectroscopic characteristics can be obtained by reading out 30 times with a change in voltage depending on the resolution if the imaging device has a unit resolution of 10 nm. In addition, the higher the resolution increases, the more the accuracy of the spectroscopic characteristics can be increased. For example, since an image sensor currently considered to be of high-speed has a pixel count of about 300 frames per second (fps), about 10 fps can lead to the determination of the spectroscopic characteristics.

Furthermore, a color image can be obtained by the reproduction of colors from the obtained spectroscopic characteristics. Therefore, a solid-state imaging device can be designed without need of any color filter. The range of applications can further extend by speeding up and enhancing the image processing ability. Therefore, for example, it can be applied to a car-mounted camera or the like.

Next, a method of manufacturing a solid-state imaging device according to an embodiment of the present invention will be described with reference to the process diagrams illustrated in FIG. 8 to FIG. 12. In these figures, the part of the region illustrated in FIG. 5 will be used as an example and the principal matters thereof will be only described.

In the following description, a thick semiconductor-on-insulator (SOI) substrate is used as the substrate.

Figure 8A:
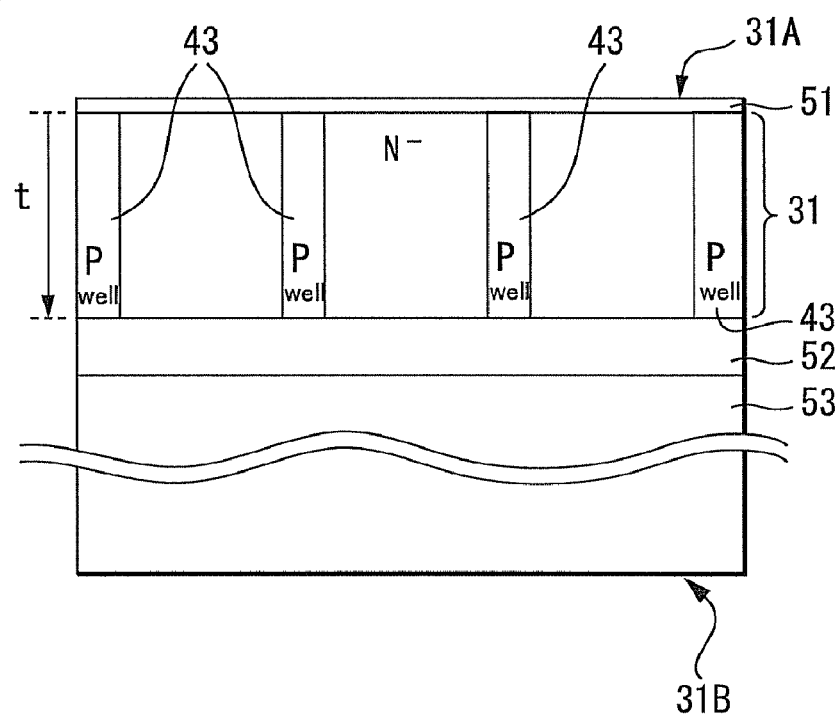
FIGS. 8A and 8B are cross-sectional diagrams illustrating a method of manufacturing a solid-state imaging device according to an embodiment of the present invention, where

First, as shown in FIG. 8A, a semiconductor layer 31 used is a silicon part or the like formed on a substrate 53 made of silicon or the like with an insulating film 52 made of an embedded oxide film or the like in between. In other words, the semiconductor substrate in the solid-state imaging device of the present embodiment is a semiconductor region mounted on part of the substrate. Preferably, the thickness t of the silicon part, the semiconductor layer 31, in the case of using the SOI substrate is comparatively thick, for example, about 10 μm to 20 μm in preferable. In addition, the semiconductor layer 31 is of a first conductivity-type type, for example an N type.

After the formation of a thin insulating layer 51 on the surface of the semiconductor layer 31 by thermal oxidation, a P-well type second conductivity-type impurity region 43 is formed by implanting an impurity such as boron. Thus, when performing ion implantation from the surface to a comparatively deep region of the semiconductor layer 31, it is preferable to carry out the ion implantation with a high-energy ion implantation apparatus capable of handling mega electron volts.

The second conductivity-type impurity regions 43 may be arranged at equal intervals in a lattice-shaped plane.

Figure 8B:
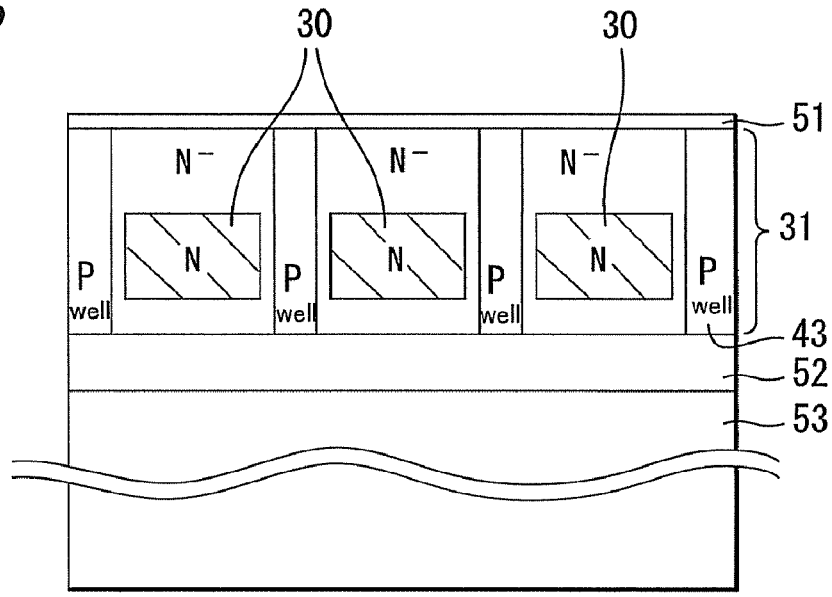

Next, as shown in FIG. 8B, a region other than the second conductivity-type impurity region 43 with a depth not to reach to the insulating film 52 is subjected to the ion implantation of an N-type first conductivity-type impurity to be provided as a lower part of a light-receiving portion, thereby forming an N-type first conductivity-type impurity region 30. In this case, furthermore, like the above second conductivity-type impurity region 43, the ion implantation is carried out with a high-energy ion implantation apparatus capable of handling mega electron volts.

The ion implantation is carried out to implant ions into an opening 33A while arranging the second conductivity-type impurity region 43 in a lattice shape in the above process. Therefore, the first conductivity-type impurity regions 30 can be arranged at equal intervals.

In this case, the ion implantation may cause a damage on an area near the surface between the pixels adjacent to each other. Thus, it is preferable to use an ion species with a small atomic weight, such as a phosphorus ion, to reduce a difference in degree of the damage between the pixels adjacent to each other.

On the other hand, for collecting electrons to the first surface 31A of the light-receiving portion, or correcting to the wiring-circuit side, it is preferable to design the ion implantation so that the impurity concentration increases at the first side 31A. Therefore, it is preferable to carry out the ion implantation while increasing a dose amount several times at the first side 31A.

Figure 9A:
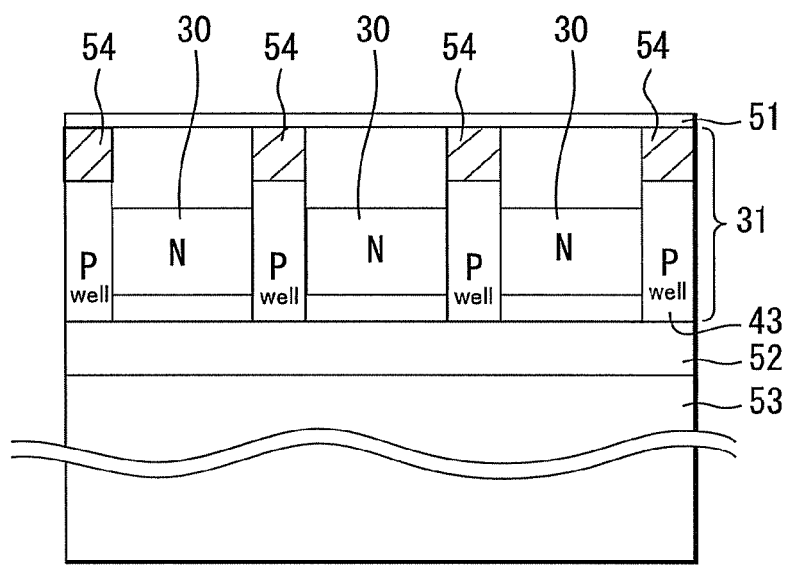
FIGS. 9A to 9C are cross-sectional diagrams illustrating a method of manufacturing a solid-state imaging device according to an embodiment of the present invention, where
Figure 9B:
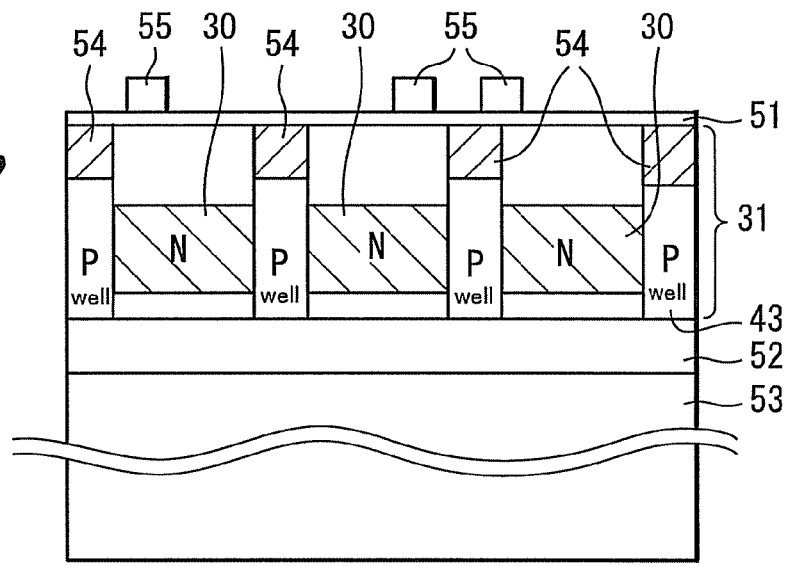

Next, as shown in FIG. 9A, a device-separating region 54 is formed. Here, the shallow trench isolation (STI) is used. In other words, the device separation is carried out by digging an opening in the semiconductor layer 31 made of silicon or the like and the opening is then embedded with $SiO_2$ or the like. In the process, there is a step of subjecting the semiconductor layer 31 to a high temperature of about 950° C., dispersing a larger amount of ions implanted in the previous step. Subsequently, as shown in FIG. 9B, a gate electrode 55 is formed above the semiconductor layer 31 through the insulating layer 51.

Figure 9C:
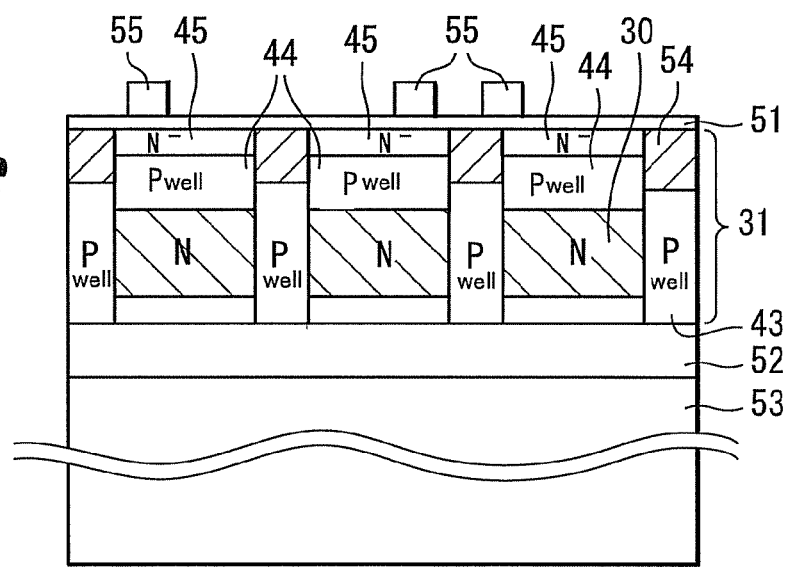

Next, as shown in FIG. 9C, the structure on the side of the first surface 31A of the light-receiving portion is formed. A second conductivity-type type, in this case, boron ions or the like are implanted into a region on the first side 31A to form a P-well type second conductivity-type impurity region 44. Then, the side wall (not shown) of the gate electrode 55 is formed and a first conductivity-type type, in this case, N-type arcenic ions are injected and then activated with a low dispersion, while passing through the step of mild heating at about 850° C. As a result, an $N^-$-type first conductivity-type impurity region 45 can be formed. The source drain of a transistor (not shown) can be also formed on this process position.

Figure 10:
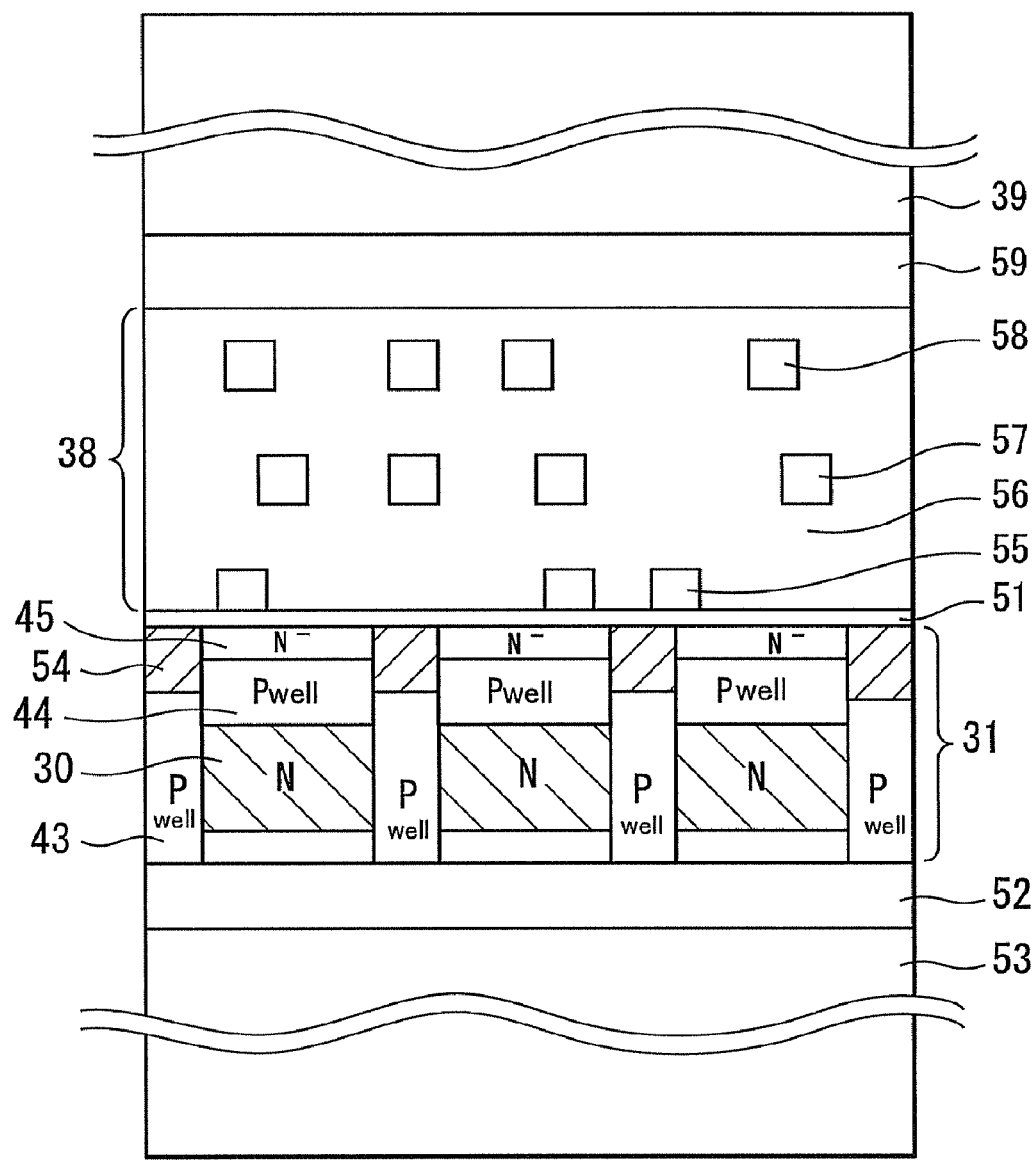
FIG. 10 is a cross-sectional diagram illustrating a method of manufacturing a solid-state imaging device according to an embodiment of the present invention.

Next, as shown in FIG. 10, wiring layers 57 and 58 are formed above the gate electrode 55 through an insulating interlayer 56, attaching a substrate-supporting member 39 made of silicon or the like with an adhesive 59 such as benzocyclobutene (BCB) resin.

Figure 11:
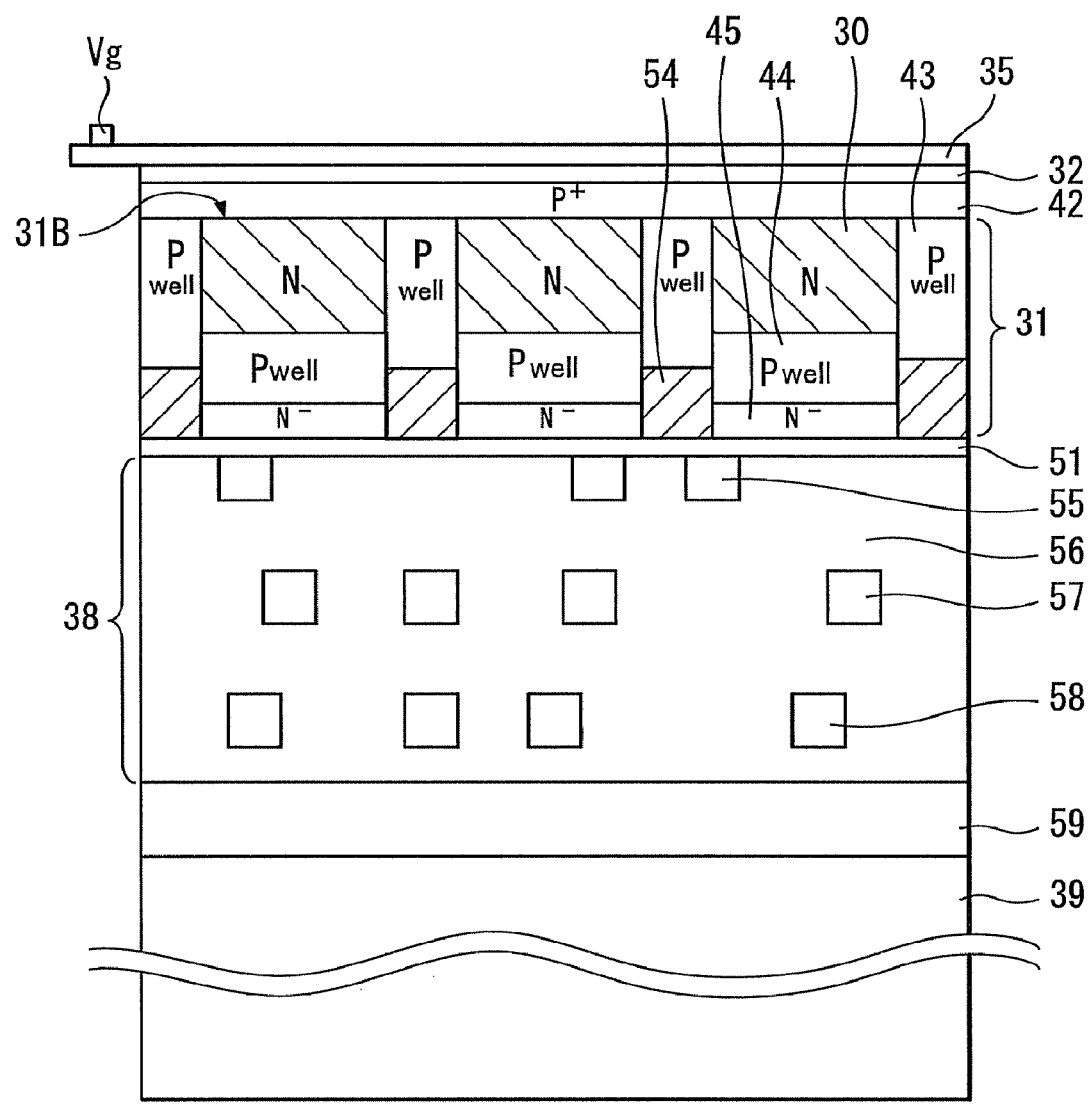
FIG. 11 is a cross-sectional diagram illustrating a method of manufacturing a solid-state imaging device according to an embodiment of the present invention.

Subsequently, the semiconductor layer 31 (or the SOI substrate) is turned upside down. The SOI substrate 53 and the insulating layer 52 formed of the embedded oxide film are removed by polishing and etching to expose the second side 31B of the semiconductor device 31. Furthermore, as shown in FIG. 11, a thin protective oxide film is formed on the surface on the second side 31B and boron ions or the like are then implanted into the surface on the second side 31B, followed by activation with laser annealing or the like to form a $P^+$-type second conductivity-type impurity region 42. Furthermore, an insulating layer 32 is formed and stacked on the $P^+$-type second conductivity-type impurity region 42.

Furthermore, an impurity-doped polysilicon layer 35 is stacked on the insulating layer 32. A gate electrode Vg is formed on part of the polysilicon layer 35.

Figure 12:
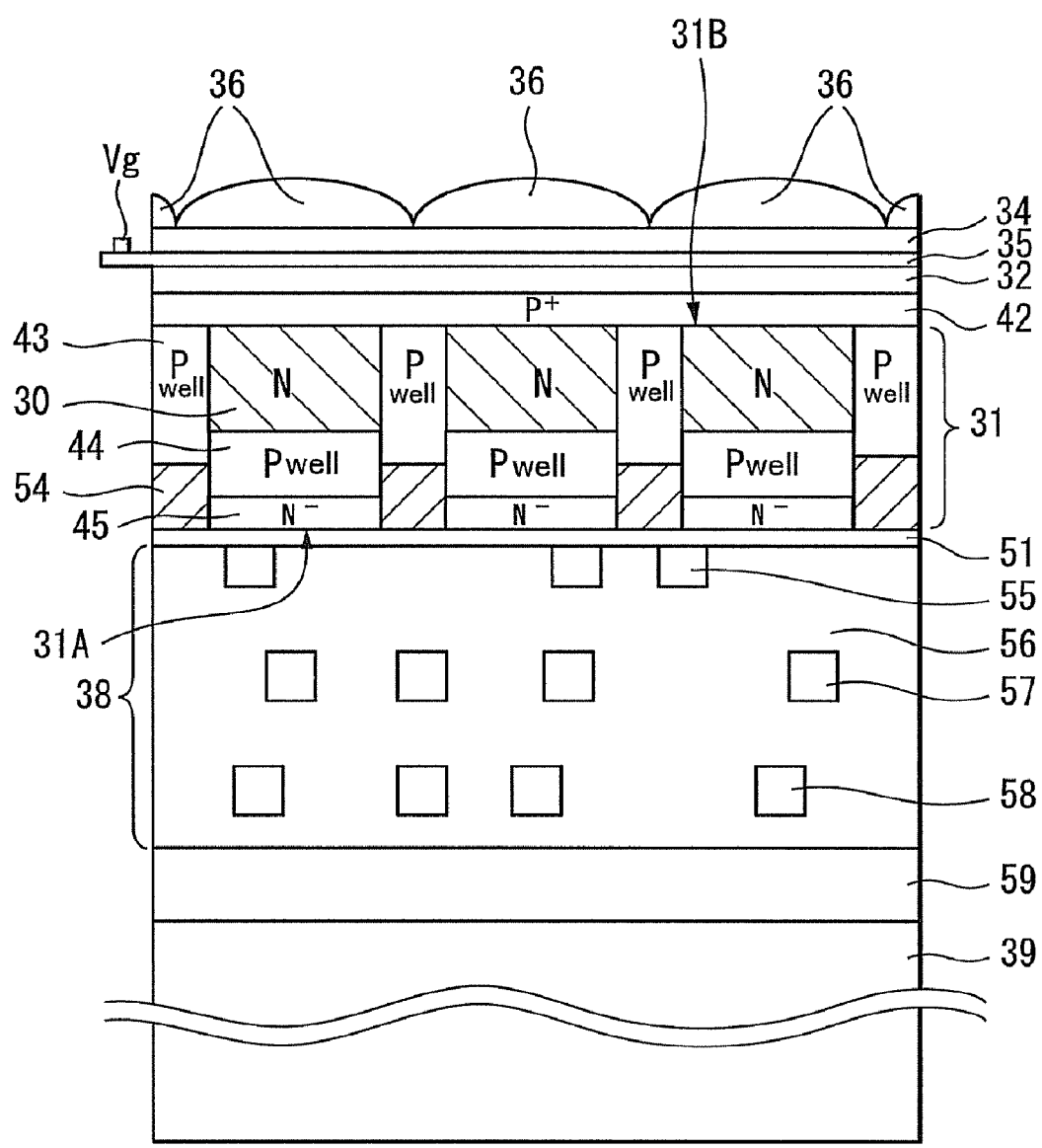
FIG. 12 is cross-sectional diagram illustrating a method of manufacturing a solid-state imaging device according to an embodiment of the present invention.

After that, as shown in FIG. 12, for example, a silicon nitride film (SiN) or the like is used in the formation of a passivation film 34 above the insulating layer 32 on the second side 31B. Subsequently, micro lenses 36 are formed on the passive film 34. These micro lenses 36 are formed above positions corresponding to the first conductivity-type impurity region 45, the second conductivity-type impurity region 44, and the first conductivity-type impurity region 30, which constitute a light-receiving portion, at substantially equal intervals.

According to the above manufacturing method, the solid-state imaging device of the present embodiment can be manufactured.

Figure 13:
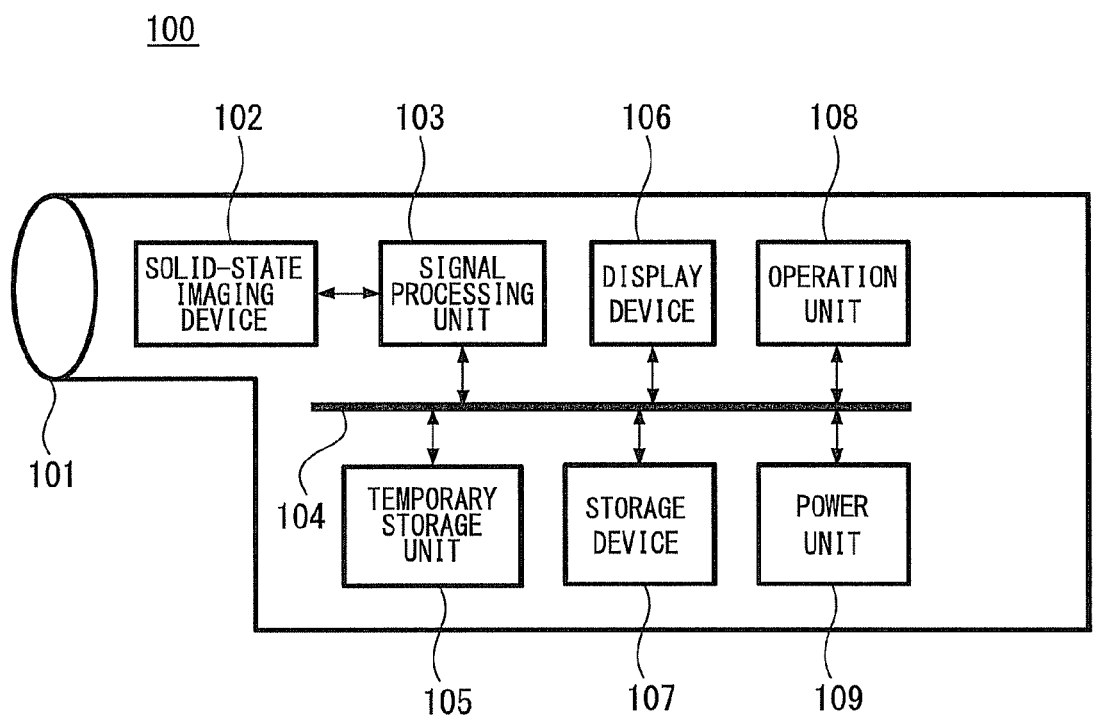
FIG. 13 is a schematic diagram illustrating a configuration of an imaging apparatus according to an embodiment of the present invention.

An imaging apparatus 100 according to an embodiment of the present invention can be manufactured as shown in FIG. 13 using the solid-state imaging device according to the embodiment of the present invention as described above. The imaging apparatus 100 as illustrated in FIG. 13 is configured as any of electronic apparatuses with imaging functions, such as a mobile phone, a digital still camera, and a video camera. The imaging apparatus 100 includes an optical unit 101, a solid-state imaging device 102, and a signal processing unit 103. The imaging apparatus 100 also includes a temporary storage unit 105, a display device 106, a storage device 107, an operation unit 108, and a power unit 109, which are connected to a signal processing unit 103, for example, through a transmission bus line 104.

The optical unit 101 includes various kinds of lenses, a shutter, an aperture, and the like and leads the image of a subject to the solid-state imaging device 102. Here, the solid-state imaging device 102 according to the above-described embodiment is included and photoelectrically converts the subject light forming an image through the optical unit 101 into signals to be output. The signal processing unit 103 includes a digital signal processor (DSP) that carries out the processing of digital signals. The signal processing unit 103 carries out the processing, such as formatting or the like on an image signal output from the solid-state imaging device 102, converting the signal into data for display or recording.

The temporary storage unit 105 includes a random access memory (RAM) and temporarily stores an image data processed by the signal processing unit 103. The display device 106 includes a liquid crystal display or the like and displays an image data processed by the above signal processing unit 103. The storage device 107 may be a flash memory, an erasable programmable ROM (EPROM), a hard disk (HD), storing an image data. The operation unit 108 includes a shutter button, various function keys, cursor key, and the like for the input of control singles from the outside to control the operation of the imaging apparatus 100. The power unit 109 supplies electric power for the operation to the respective units of the imaging apparatus 100.

Since the imaging apparatus 100 includes the solid-state imaging device of the aforementioned embodiment to carry out the signal processing with sampling at equal intervals. Therefore, complicated signal processing can be avoided.

Furthermore, the configuration of the imaging apparatus 100 is not limited to one as described above. The imaging apparatus 100 may be formed with any of various configurations.

As described above, the sensor of the present embodiment as well as the solid-state imaging device and the imaging apparatus each using such a sensor employ a back-illuminated sensor or an imaging device to allow the spectroscopic characteristics to be widely measured at high sensitivity.

In the case of a front-illuminated imaging device according to the related-art, an electrode and a circuit unit are mounted above the side of a photodiode on which light is incident. Thus, opening surface is narrow. Besides, the use of a transparent electrode leads to a considerable decrease in sensitivity with respect to ultraviolet or blue light with shorter wavelengths. In contrast, the back-illuminated imaging device of the present embodiment has high sensitivity, because no electrode and circuit unit is provided on the light-incident side, particularly spectroscopic characteristics at shorter wavelengths are improved.

Therefore, spectroscopic characteristics can be determined at a wide range of wavelengths including an ultraviolet region. In addition, it can be used as a sensor for the measurement with the same accuracy as that of a spectroscope.

Furthermore, a sensor according to the related-art changes the depth for capturing electrons by changing a gate voltage every one hundred eightieth of a second. In contrast, the use of the sensor according to the embodiment of the invention as described above is capable of shortening the measurement time compared with that of the related art, thereby realizing the spectroscopic processing at a high speed.

Furthermore, the use of the above sensor as a pixel region leads to configure a solid-state imaging device capable of obtaining a color image, using spectroscopic characteristics. In this case, any color filter may not be required, because the sensor of the present embodiment is used. Besides, colors can be reproduced from the spectroscopic characteristics without restriction.

Furthermore, the use of the sensor as described above makes it possible to carry out a spectroscopic measurement on a plane as a two-dimensional measurement in contrast to a point measurement or line measurement according to the related-art.

In addition, the sensor is of a back-illuminated type. Thus, there is no need of any wiring design considering the light-receiving surface. Therefore, the flexibility of designing the wiring of the pixel region increases, allowing the pixels to be miniaturized.

Furthermore, the process designing is carried out with a high degree of accuracy to make it possible to carry out process design with a high degree of accuracy, allowing a high-speed imaging. Thus, the above imaging apparatus is applicable to all of sensors and imaging devices.

The present invention is not limited to the aforementioned configuration and may be embodied in various other forms without departing from the gist of the present invention.

It should be understood by those skilled in the art that various modifications, combinations, sub-combinations and alterations may occur depending on design requirements and other factors insofar as they are within the scope of the appended claims or the equivalents thereof.

What is claimed is:

1. A sensor, comprising:
a semiconductor layer;
a photodiode formed in the semiconductor layer;
an impurity-doped polycrystalline silicon layer formed above the semiconductor layer; and
a gate electrode via which a gate voltage is applied to the polycrystalline silicon layer,
wherein,
a wiring layer is provided on a first surface of the semiconductor layer and light is incident on a second surface thereof, and
the photodiode includes a first conductivity-type impurity region, a second conductivity-type impurity region, a first conductivity-type impurity region, and a second conductivity-type impurity region, which are stacked.

2. A sensor, comprising:
a semiconductor layer;
a photodiode formed in the semiconductor layer;
an impurity-doped polycrystalline silicon layer formed above the semiconductor layer; and
a gate electrode via which a gate voltage is applied to the polycrystalline silicon layer,
wherein,
a wiring layer is provided on a first surface of the semiconductor layer and light is incident on a second surface thereof, and
the photodiode has a P$^+$NPN junction structure.

3. The sensor according to claim 1, wherein the photodiode is formed using a first conductivity-type impurity substrate.

4. A solid-state imaging device, comprising:
pixels, each including a photodiode formed in a semiconductor layer, an impurity-doped polycrystalline silicon layer formed above the photodiode, and a gate electrode via which a gate voltage is applied to the polycrystalline silicon layer; and
a pixel region including a two-dimensional arrangement of the pixels,
wherein,
a wiring layer is provided on a first surface of the semiconductor layer and light is incident on a second surface thereof, and
each photodiode includes a first conductivity-type impurity region, a second conductivity-type impurity region, a first conductivity-type impurity region, and a second conductivity-type impurity region, which are stacked.

5. An imaging apparatus comprising:
an optical unit;
a solid-state imaging device; and
a signal processing unit,
wherein,
the solid-state imaging device includes
(a) pixels, each including a photodiode formed in a semiconductor layer, an impurity-doped polycrystalline silicon layer formed above the photodiode, and a gate electrode via which a gate voltage is applied to the polycrystalline silicon layer; and
(b) a pixel region including a two-dimensional arrangement of the pixels,
and wherein,
a wiring layer is provided on a first surface of the semiconductor layer and light is incident on a second surface thereof, and
each photodiode includes a first conductivity-type impurity region, a second conductivity-type impurity region, a first conductivity-type impurity region, and a second conductivity-type impurity region, which are stacked.

6. A method of manufacturing an imaging apparatus, comprising the steps of:
forming a photodiode in a semiconductor layer having first and second surfaces;
forming an impurity-doped polycrystalline silicon layer above the photodiode;
forming a gate electrode on the semiconductor layer for applying a gate voltage to the polycrystalline silicon layer;
providing a wiring layer on the first surface of the semiconductor layer, the second surface designated for receiving incident light therethrough,
wherein,
the photodiode includes a first conductivity-type impurity region, a second conductivity-type impurity region, a first conductivity-type impurity region, and a second conductivity-type impurity region, which are stacked.

7. A solid-state imaging device, comprising:

pixels, each including a photodiode formed in a semiconductor layer, an impurity-doped polycrystalline silicon layer formed above the photodiode, and a gate electrode via which a gate voltage is applied to the polycrystalline silicon layer; and a pixel region including a two-dimensional arrangement of the pixels, wherein,
 a wiring layer is provided on a first surface of the semiconductor layer and light is incident on a second surface thereof, and
 each photodiode has a P$^+$NPN junction structure.

8. An imaging apparatus comprising:

an optical unit;
a solid-state imaging device; and
a signal processing unit,
wherein,
 the solid-state imaging device includes
 (a) pixels, each including a photodiode formed in a semiconductor layer, an impurity-doped polycrystalline silicon layer formed above the photodiode, and a gate electrode via which a gate voltage is applied to the polycrystalline silicon layer; and
 (b) a pixel region including a two-dimensional arrangement of the pixels,
and wherein,
 a wiring layer is provided on a first surface of the semiconductor layer and light is incident on a second surface thereof, and
 each photodiode has a P$^+$NPN junction structure.

9. A method of manufacturing an imaging apparatus, comprising the steps of:

forming a photodiode in a semiconductor layer having first and second surfaces;

forming an impurity-doped polycrystalline silicon layer above the photodiode;

forming a gate electrode on the semiconductor layer for applying a gate voltage to the polycrystalline silicon layer;

providing a wiring layer on the first surface of the semiconductor layer, the second surface designated for receiving incident light therethrough, wherein,
 the photodiode has a P$^+$NPN junction structure.

* * * * *